US006104240A

United States Patent [19]

Fujimoto et al.

[11] Patent Number: 6,104,240

[45] Date of Patent: Aug. 15, 2000

[54] MICROWAVE CIRCUIT AND METHOD OF MANUFACTURING MICROWAVE CIRCUIT

[75] Inventors: Sinichi Fujimoto; Yoshinobu Sasaki, both of Tokyo, Japan

[73] Assignee: Mitsubishi Denki Kabushiki Kaisha, Tokyo, Japan

[21] Appl. No.: 09/220,448

[22] Filed: Dec. 24, 1998

[30] Foreign Application Priority Data

Jul. 14, 1998 [JP] Japan .................................. 10-198604

[51] Int. Cl.[7] ................................ H03F 1/36; H01P 1/10; H01P 1/22

[52] U.S. Cl. ............................ 330/86; 333/104; 333/111; 333/116; 333/81 A; 333/262

[58] Field of Search .................................... 333/103, 104, 333/111, 116, 81 A, 262, 161, 164; 330/86; 455/78, 80, 82, 83

[56] References Cited

U.S. PATENT DOCUMENTS

| | | | |
|---|---|---|---|
| 3,512,110 | 5/1970 | Clar | 333/116 |
| 5,298,873 | 3/1994 | Ala-Kojola | 333/235 |

FOREIGN PATENT DOCUMENTS

| | | | |
|---|---|---|---|
| 5199003 | 8/1993 | Japan . | |
| 1220031 | 3/1986 | U.S.S.R. | 333/104 |

*Primary Examiner*—Paul Gensler
*Attorney, Agent, or Firm*—Leydig, Voit & Mayer, Ltd.

[57] ABSTRACT

A microwave circuit having a coupler with two microstrip conductors on a front surface of a substrate, parallel to each other, and electromagnetically coupled to each other with a coupling coefficient wherein the substrate has a rear surface on which a grounding conductor is formed. A floating conductor is interposed between the microstrip conductors. A first terminal of a switching device is connected to one end of the floating conductor while a second terminal of the switching device is grounded. By selectively turning on and off the switching device, the coupling coefficient is changed.

7 Claims, 12 Drawing Sheets

First Preferred Embodiment

First Preferred Embodiment

Characteristics of Transmission Coefficient from Port P1 to Port P2

First Preferred Embodiment

Characteristics of Transmission Coefficient from Port P1 to Port P2 when Width w is Changed Second Preferred Embodiment
Characteristics of Transmission Coefficient from Port P1 to Port P2
When FETs 41 to 43 are Switched over

MICROWAVE CIRCUIT AND METHOD OF MANUFACTURING MICROWAVE CIRCUIT

1. FIELD OF THE INVENTION

The present invention relates to a microwave circuit comprising a switching circuit having a coupler and operating in a microwave band, quasi-millimeter wave band, a millimeter wave band or the like, which are the frequency bands equal to or higher than approximately 1 GHz and equal to or lower than 300 GHz, and also relates to a method of manufacturing the microwave circuit.

2. DESCRIPTION OF THE PRIOR ART

FIG. 12 is a circuit diagram of a prior art microwave switching circuit. In this prior art, a one-input and three-output switching circuit is constructed of a GaAs PIN type MMIC. In FIG. 12, a port P31 is connected to a connection point P35 via a transmission line 151. The connection point P35 is connected to a port P32 via a coupling capacitor C1 and an impedance-matching quarter-wave plate (transmission line) 152, while the port P32 is grounded via a diode D1. The connection point P35 is connected to a port P33 via a coupling capacitor C2 and an impedance-matching quarter-wave plate (transmission line) 153, while the port P33 is grounded via a diode D2. Further, the connection point P35 is connected to the port P34 via a coupling capacitor C3 and an impedance-matching quarter-wave plate (transmission line) 154, while the port P34 is grounded via a diode D3. In this case, a DC voltage for use in turning on and off is applied to the diodes D1, D2 and D3, and the capacitors C1, C2 and C3 are provided for interrupting DC components of these DC voltages, respectively.

In the prior art constructed as above, if, for example, a predetermined positive DC voltage is applied in the forward direction to the diodes D2 and D3 while applying no DC voltage to the diode D1, then the diode D1 is turned off and the diodes D2 and D3 are turned on. In this case, a microwave signal inputted to the port P31 is outputted from the transmission line 151 to the port P32 via the connection point P35, the coupling capacitor C1 and the quarter-wave plate 152.

However, the above arrangement requires the three quarter-wave plates 152, 153 and 154 and the transmission line 151, and therefore, the circuit is relatively increased in size. In particular, in a higher frequency band, the off-state capacitances of the diodes D1, D2 and D3 become relatively large, and this leads such a problem that the amount of attenuation is relatively small (25 dB, for example) when the switching circuit is turned off.

SUMMARY OF THE INVENTION

An essential object of the present invention is to solve the above-mentioned problems, and to provide a microwave circuit provided with a switching circuit that is more compact and lightweight than the prior art and has a greater amount of attenuation in an off-state than that of the prior art.

Another object of the present invention is to provide a method of manufacturing a microwave circuit, capable of changing the amount of attenuation in a microwave circuit provided with a switching circuit that is more compact and lightweight than that of the prior art and has a greater amount of attenuation in the off-state than that of the prior art.

In order to achieve the aforementioned objective, according to one aspect of the present invention, there is provided a microwave circuit comprising:

a substrate having first and second surfaces parallel to each other;

two microstrip conductors formed on the first surface of said substrate to be adjacently arranged parallel to each other so as to be electromagnetically coupled with each other with a predetermined coupling coefficient;

a grounding conductor formed on the second surface of said substrate;

at least one floating conductor formed on the first surface of said substrate so as to be interposed between said two microstrip conductors; and a switching device having one terminal connected to at least one end of said floating conductor and having the other terminal grounded, said switching device being selectively turned on or off, wherein said substrate, said two microstrip conductors and said grounding conductor constitute a coupler, wherein said floating conductor is grounded when said switching device is turned on, while said floating conductor has a predetermined floating potential when said switching device is turned off, and said coupling coefficient is changed by selectively turning on or off said switching device.

In the above-mentioned microwave circuit, said switching device is preferably either a field-effect transistor or a diode.

The above-mentioned microwave circuit preferably further comprises an amplifier connected to either one of said two microstrip conductors.

The above-mentioned microwave circuit preferably further comprises:

a plurality of said floating conductors formed so as to be arranged parallel to each other; and a plurality of said switching devices connected respectively to said plurality of floating conductors, wherein said coupling coefficient is stepwise changed by turning on or off said plurality of switching devices.

The above-mentioned microwave circuit preferably further comprises an amplifier connected to either one of said two microstrip conductors.

The above-mentioned microwave circuit preferably further comprises:

an amplifier having an input port, an output port and a feedback loop; and a predetermined feedback circuit, wherein said feedback loop is constructed by connecting in series said microwave circuit and said feedback circuit, wherein said microwave circuit operates as a feedback type amplifier.

In the above-mentioned microwave circuit, said coupler is preferably a quarter-wave coupled-line type directional coupler.

According to another aspect of the present invention, there is provided a microwave circuit comprising:

a substrate having first and second surfaces parallel to each other;

two microstrip conductors formed on the first surface of said substrate to be adjacently arranged parallel to each other so as to be electromagnetically coupled with each other with a predetermined coupling coefficient;

a grounding conductor formed on the second surface of said substrate;

a third microstrip conductor formed on the first surface of said substrate to be adjacently arranged parallel to said first microstrip conductor so as to be electromagnetically coupled with said first microstrip conductor with a predetermined second coupling coefficient;

at least one first floating conductor formed on the first surface of said substrate so as to be interposed between said first and second microstrip conductors;

at least one second floating conductor formed on the first surface of said substrate so as to be interposed between said first and third microstrip conductors;

a first switching device having one terminal connected to at least one end of said first floating conductor and having the other terminal grounded, said first switching device being selectively turned on or off; and a second switching device having one terminal connected to at least one end of said second floating conductor and having the other terminal grounded, said second switching being selectively turned on or off, wherein said substrate, said two microstrip conductors and said grounding conductor constitute a coupler, wherein said first coupling coefficient becomes greater than said second coupling coefficient when said first switching device is turned off and said second switching device is turned on, while said first coupling coefficient becomes smaller than said second coupling coefficient when said first switching device is turned on and said second switching device is turned off, and wherein said microwave circuit operates as a switching circuit to selectively and electromagnetically couple said first microstrip conductor with either one of said second microstrip conductor and said third microstrip conductor.

The above-mentioned microwave circuit preferably further comprises:

first phase shifting means, connected to said second microstrip conductor, for shifting a signal inputted from said second microstrip conductor by a first phase shift amount, and outputting the resulting phase-shifted signal;

second phase shifting means, connected to said third microstrip conductor, for shifting a signal inputted from said third microstrip conductor by a second phase shift amount, and outputting the resulting phase-shifted signal; and combining means for combining the signal outputted from said first phase shifting means with the signal outputted from said second phase shifting means, and outputting the resulting combined signal.

In the above-mentioned microwave circuit, said first microstrip conductor is connected to an antenna, said second microstrip conductor is connected to a transmitter, said third microstrip conductor is connected to a receiver, and wherein said microwave circuit operates as a transmission and reception switchover circuit for a transceiver.

According to a further aspect of the present invention, there is provided a method of manufacturing a microwave circuit, comprising the steps of:

forming a coupler comprising two microstrip conductors on a substrate to be adjacently arranged parallel to each other so as to be electromagnetically coupled with each other with a predetermined coupling coefficient, said substrate having a rear surface on which a grounding conductor is formed;

forming at least one floating conductor on said substrate so that said floating conductor is interposed between said two microstrip conductors;

forming a switching device having one terminal connected to at least one end of said floating conductor and having the other terminal grounded, said switching device being selectively turned on or off; and adjusting said coupling coefficient by changing a total length of said floating conductor relative to said first and second microstrip conductors.

BRIEF DESCRIPTION OF THE DRAWINGS

These and other objects and features of the present invention will become clear from the following description taken in conjunction with the preferred embodiments thereof with reference to the accompanying drawings throughout which like parts are designated by like reference numerals, and in which.

DETAILED DESCRIPTION OF THE PREFERRED EMBODIMENTS

Preferred Embodiments of the present invention will be described below with reference to the accompanying drawings.

First Preferred Embodiment

Figure 1:
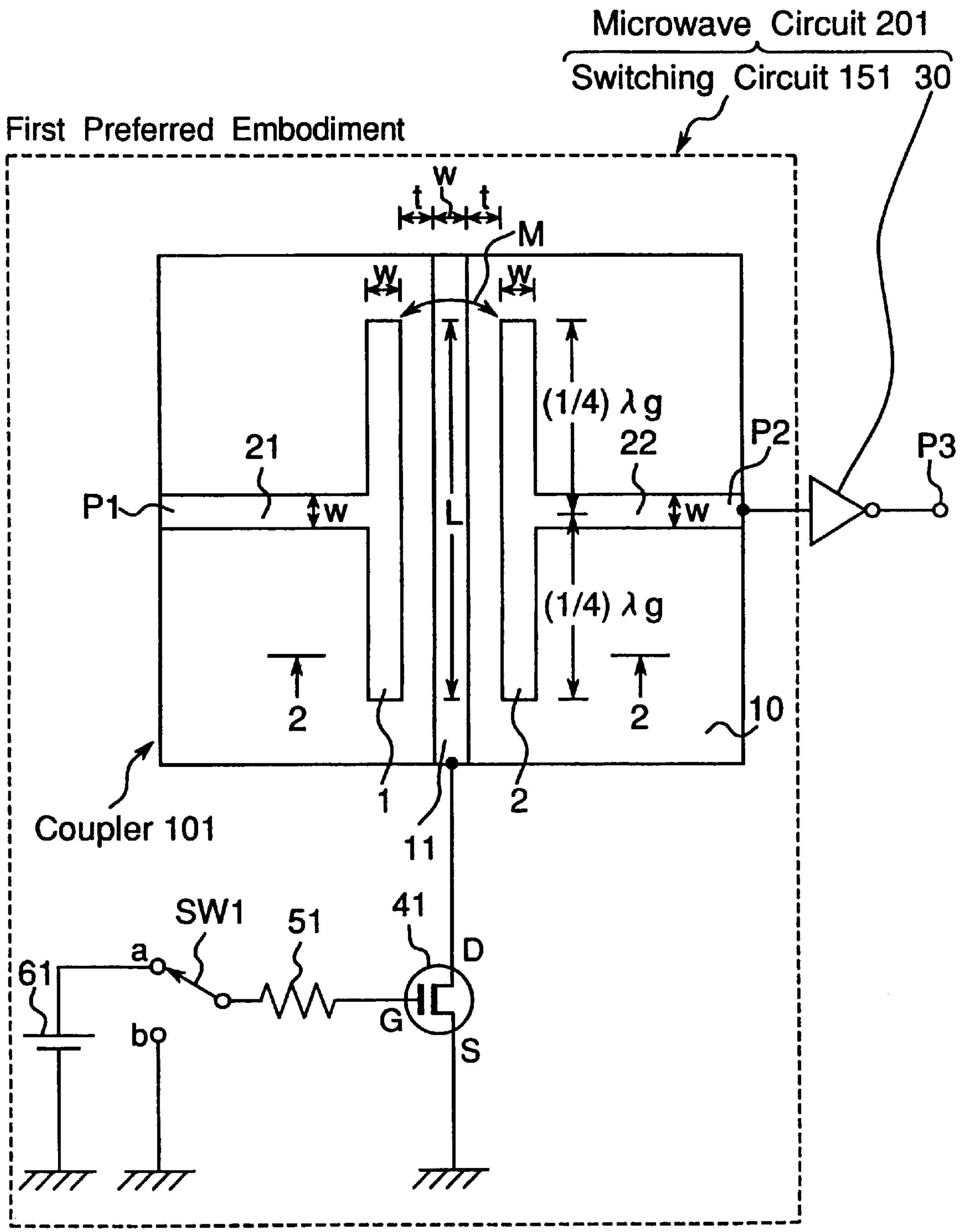
FIG. 1 is a plan view and circuit diagram showing a construction of a microwave circuit according to a first preferred embodiment of the present invention.
Figure 2:
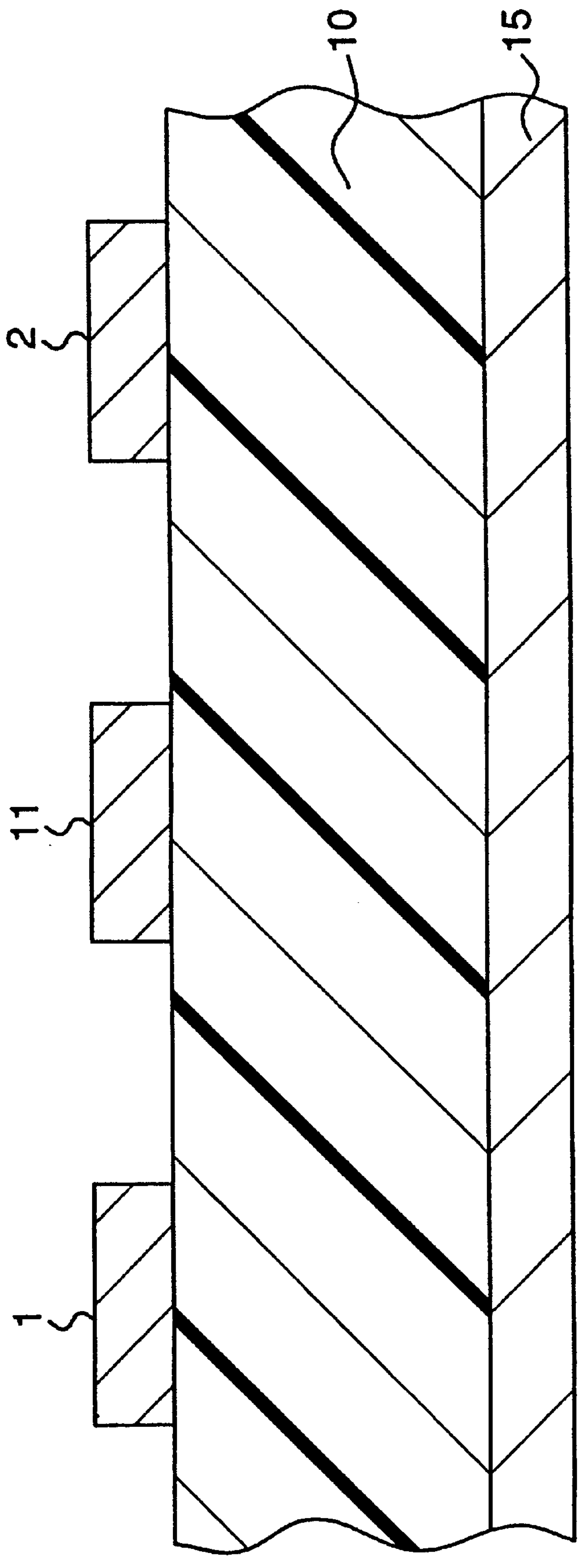
FIG. 2 is a longitudinal sectional view taken along the line 2—2 of a switching circuit included in the microwave circuit of FIG. 1.

FIG. 1 is a plan view and circuit diagram showing a construction of a microwave circuit 201 according to a first preferred embodiment of the present invention, while FIG. 2 is a longitudinal sectional view taken along the line 2—2 of a coupler 101 included in the microwave circuit 201 of FIG. 1.

The microwave circuit 201 of the present preferred embodiment is provided with a switching circuit 151 and an amplifier 30, and, as shown in FIGS. 1 and 2, the switching circuit 151 is provided with the following:

(a) a coupler 101 having two microstrip conductors 1 and 2 which are formed on a top surface of a dielectric substrate 10 having the top surface and a rear surface, which are parallel to each other, wherein a grounding conductor 15 is formed on the rear surface, wherein the two microstrip conductors 1 and 2 are adjacently arranged parallel to each other so as to be electromagnetically coupled with each other, and wherein the coupler 101 further comprises a floating conductor 11 interposed between the microstrip conductors 1 and 2; and (b) a source-grounded field-effect transistor (referred to as an FET hereinafter) 41 for effecting switchover between connection and disconnection of one end of the floating conductor 11 to the ground.

In the switching circuit 151 shown in FIG. 1 and FIG. 2, the two microstrip conductors 1 and 2 are formed so as to be adjacently arranged parallel to each other and electromagnetically coupled with each other on the dielectric substrate 10 having the rear surface on which the grounding conductor 15 is formed, and each of the microstrip conductors 1 and 2 has a length of (½)λg and a width w. In this case, λg is the guide wavelength. Then, the floating conductor 11 is formed so as to be interposed between the two microstrip conductors 1 and 2 and arranged parallel to the two microstrip conductors 1 and 2 on the dielectric substrate 10, and the floating conductor 11 has a length longer than (½)λg and the width w. In this case, an interval between the floating conductor 11 and the microstrip conductor 1 and an interval between the floating conductor 11 and the microstrip conductor 2 are each set to an identical interval t. Further, a microstrip conductor 21 that has a width w and extends from the center point in the lengthwise direction of the microstrip conductor 1 to the approximate center point of one side of the dielectric substrate 10 is formed on the dielectric substrate 10, and the end portion on the approximate center point side of one side of the dielectric substrate 10 is made to serve as a port P1. A microstrip conductor 22 that has a width w and extends from the center point in the lengthwise direction of the microstrip conductor 2 to the approximate center point of one side (referred to as the opposite one side hereinafter) of the dielectric substrate 10 is opposite the port P1 on the dielectric substrate 10, and the end portion on the approximate center point side of the opposite side of the dielectric substrate 10 is a port P2.

In this case, the microstrip conductor 1 and the grounding conductor 15 constitute a microstrip line, the microstrip conductor 2 and the grounding conductor 15 constitute a microstrip line, the microstrip conductor 21 and the grounding conductor 15 constitute a microstrip line and the microstrip conductor 22 and the grounding conductor 15 constitute a microstrip line. The microstrip conductor 1 and the microstrip conductor 2 are electromagnetically coupled with each other with a coupling coefficient M and a coupling length L via the floating conductor 11. In this case, the coupling length L is the length in the lengthwise direction of the floating conductor 11 which is effective for the electromagnetic coupling of the microstrip conductors 1 and 2. In the above-mentioned manner, the coupler 101 having the port P1 and the port P2 is formed.

One end of the floating conductor 11 is connected to the drain of the FET 41, while the source of the FET 41 is grounded. The gate of the FET 41 is connected to the common terminal of a switch SW1 via a DC voltage applying resistor 51 having a relatively large resistance. A contact "a" of the switch SW1 is connected to the positive pole of a DC power source 61 having a predetermined DC voltage, while a contact "b" of the switch SW1 is grounded. In this case, the negative pole of the DC power source 61 is grounded.

In this case, the coupler 101, the FET 41 and its peripheral circuit constitute the switching circuit 151. The port P2 of the coupler 101 is connected to a port P3 via an amplifier 30 that is an inverting amplifier. In this case, the switching circuit 151 and the amplifier 30 constitute a microwave circuit 201, an amplifier circuit capable of switching between amplification and attenuation (i.e., capable of changing the amplification degree) as described later.

If the switch SW1 is switched to the contact "a" side in the switching circuit 151 constructed as above, then a predetermined positive DC voltage is applied to the gate of the FET 41, by which the FET 41 is turned on and the floating conductor 11 is grounded to have a ground potential. If the switch SW1 is switched to the contact "b" side, then the gate of the FET 41 is grounded, the FET 41 is turned off and the floating conductor 11 becomes a floating potential that is not the ground potential.

In this case, if a microwave signal is inputted to the port P1 when a predetermined load is connected to the port P3 and the FET 41 is turned off, then the microstrip conductor 1 is electromagnetically coupled with a large coupling coefficient M to the microstrip conductor 2 via the floating conductor 11 having a floating potential. Therefore, the inputted microwave signal is outputted from the microstrip conductor 1 to the microstrip conductor 2 via the floating conductor 11 and further outputted to the port P3 via the port P2 and the amplifier 30. The floating conductor 11 is grounded when the FET 41 is turned on, and therefore, the degree of electromagnetic coupling, or the coupling coefficient of the microstrip conductor 1 with the microstrip conductor 2 becomes smaller than when the FET 41 is turned off. If a microwave signal having a blocking frequency, as described later, is inputted to the port P1, then the inputted microwave signal is inputted to the microstrip conductor 1 and attenuated by the floating conductor 11. Consequently, a microwave signal attenuated with a predetermined amount of attenuation is outputted from the microstrip conductor 2 and outputted further to the port P3 via the port P2 and the amplifier 30. In this case, if the amount of attenuation is extremely large, then the inputted microwave signal is scarcely outputted to the port P2. It is to be noted that the coupler 101 is a reversible circuit.

Figure 3:
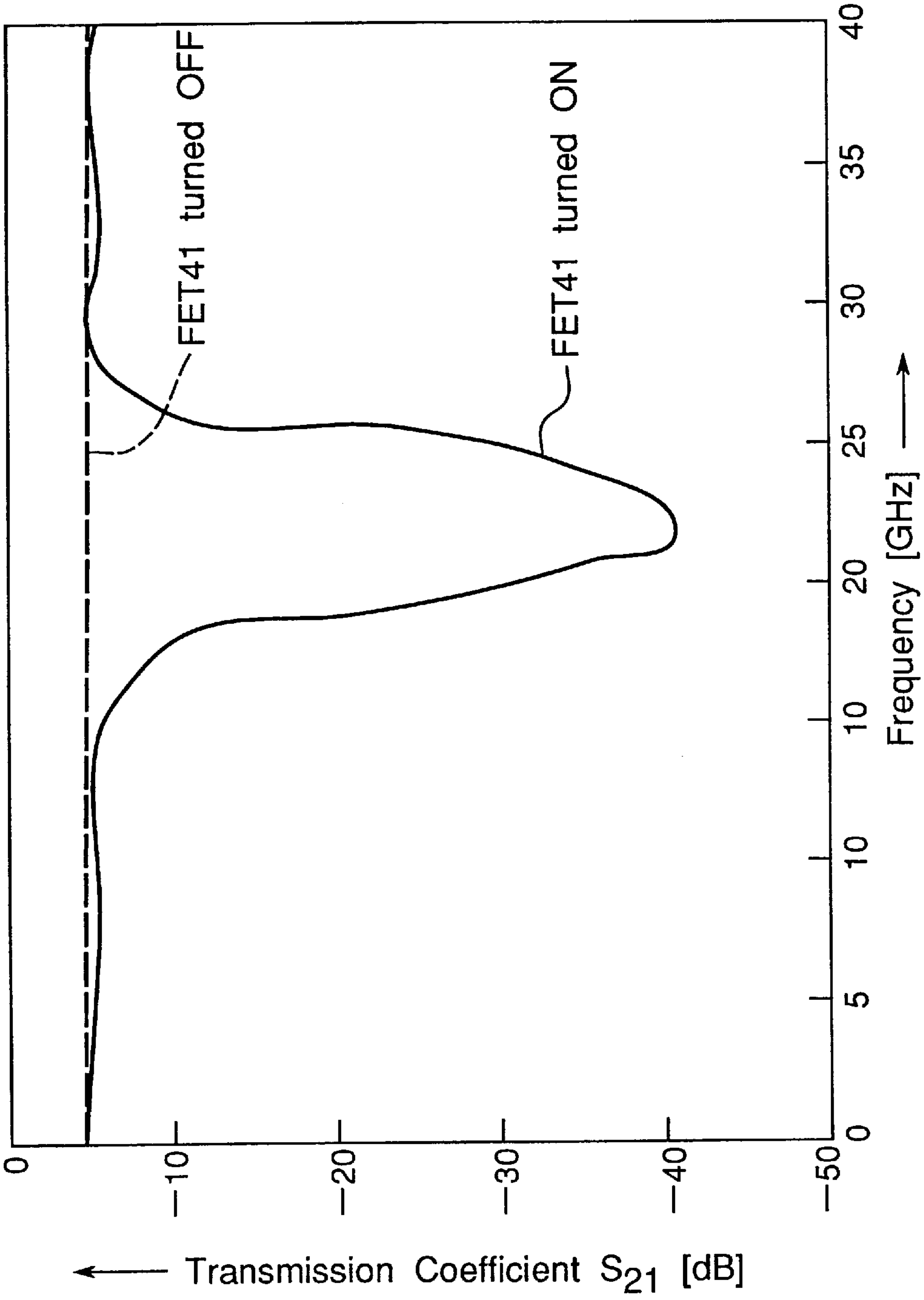
FIG. 3 is a graph showing characteristics of a transmission coefficient from a port P1 to a port P2 of the switching circuit of FIG. 1, and representing a relation between a transmission coefficient $S_{21}$ [dB] and frequency [GHz]

FIG. 3 is a graph showing characteristics of a transmission coefficient from the port P1 to the port P2 of the switching circuit 151 of FIG. 1, and representing a relation between a transmission coefficient $S_{21}$ (dB) and the inputted microwave frequency (GHz). As is apparent from FIG. 3, the transmission coefficient $S_{21}$ has an attenuation of about −3 dB over almost all the frequency regions when the FET 41 is turned off. However, the transmission coefficient $S_{21}$ becomes about −40 dB at a blocking frequency of about 23 GHz when the FET 41 is turned on. That is, by turning on or off the FET 41 in a switching manner, the input microwave signal having a predetermined blocking frequency can be switched to be transmitted from the port P1 to the port P2 or prevented from being transmitted by attenuation. The former case will be referred to as a transmission mode, while the latter case will be referred to as an attenuation mode hereinbelow. As is apparent from FIG. 3, the frequency band including the attenuation mode is a relatively wide band in the aimed frequency.

Therefore, the microwave circuit 201 of the present preferred embodiment can switch between transmission, attenuation or the interruption of microwave signal from the port P1 to the port P2 by the above-mentioned effect, as a consequence of which the amount of attenuation is greater in the off-state than in the prior art. The microwave circuit 201 of the present preferred embodiment does not require a manufacturing process of high accuracy, and therefore, the circuit can be easily manufactured at low cost. Furthermore, the circuit requires neither an input nor an output matching circuit such as the quarter-wave plates 152, 153 and 154 or the like as compared with the prior art, and therefore, the circuit can be more compact and reduced in weight.

Figure 4:
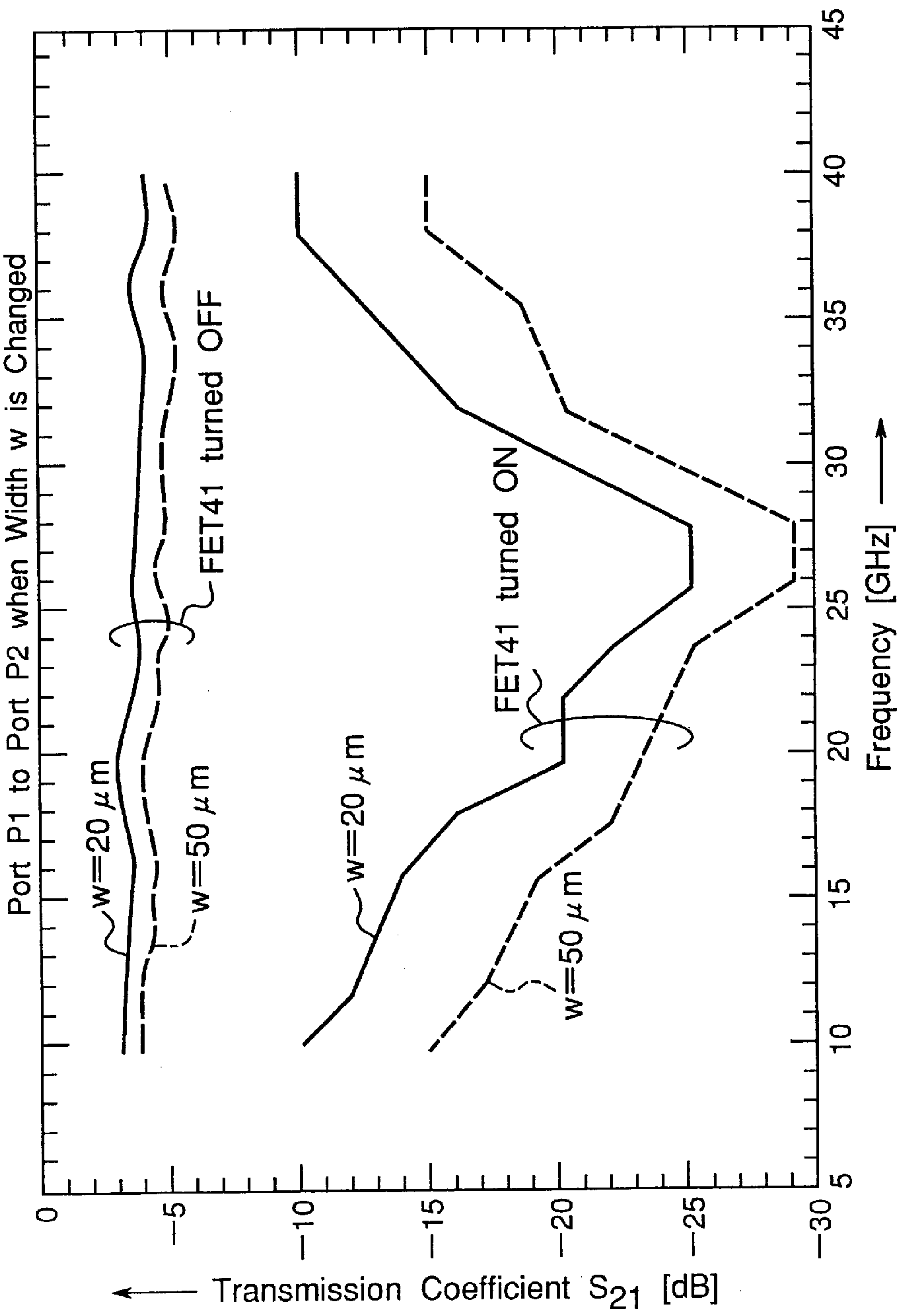
FIG. 4 is a graph showing characteristics of a transmission coefficient from the port P1 to the port P2 in the case where the width w of each of microstrip conductors is changed in the switching circuit of FIG. 1, and representing a relation between the transmission coefficient $S_{21}$ [dB] and the frequency [GHz]

FIG. 4 is a graph showing characteristics of a transmission coefficient from the port P1 to the port P2 in the case where the width w of each of the microstrip conductors 1 and 2 is changed in the switching circuit 151 of FIG. 1, and representing a relation between the transmission coefficient $S_{21}$ (dB) and the frequency (GHz). FIG. 4 shows the transmission coefficient $S_{21}$ when the widths w of the microstrip conductors 1 and 2 are set to 20 $\mu$m and 50 $\mu$m, respectively.

As is apparent from FIG. 4, when the FET 41 is turned off, the transmission coefficient $S_{21}$ becomes about −3 dB over all the frequency regions when the width w is 20 $\mu$m, and the transmission coefficient $S_{21}$ becomes about −4 dB over all the frequency regions when the width w is 50 $\mu$m. When the FET 41 is turned on, the characteristic curve of the transmission coefficient $S_{21}$ when the width w is 20 $\mu$m and the characteristic curve of the transmission coefficient $S_2$, when the width w is 50 $\mu$m are roughly similar to each other. However, it can be found that the transmission coefficient $S_{21}$ when the width w is 50 $\mu$m has an amount of attenuation larger by 3 to 5 decibels throughout the frequency regions of the inputted microwave than the transmission coefficient $S_{21}$ when the width w is 20 $\mu$m. This means that the transmission impedance of the microstrip line including the microstrip conductors 1 and 2 is changed by changing the width w of the microstrip conductors 1 and 2. In particular, the coupling coefficient of the microstrip conductors 1 and 2 changes, as a consequence of which the transmission coefficient $S_{21}$ changes, and in particular, the amount of attenuation changes when the FET 41 is turned on. Therefore, by changing the width w of each of the microstrip conductors 1 and 2, the attenuation characteristic of the switching circuit 151 can be adjusted.

Although the width w is changed in the foregoing experimental example, the present invention is not limited to this, and it is acceptable to change the interval t or the coupling length L. If the interval t is increased, then the coupling coefficient M is reduced, and the transmission coefficient $S_{21}$ is reduced in the transmission mode and the attenuation mode. If the interval t is reduced, then the coupling coefficient M is increased, and the transmission coefficient $S_{21}$ is increased in the transmission mode and the attenuation mode. If the coupling length L is reduced, then the coupling coefficient M is reduced and the transmission coefficient $S_{21}$ is reduced in the transmission mode and the attenuation mode. If the coupling length L is increased, then the coupling coefficient M is increased, and the transmission coefficient $S_{21}$ is increased in the transmission mode and the attenuation mode. In this case, the coupling length L is the length of the floating conductor 11 that is electromagnetically or effectively opposite to the microstrip conductors 1 and 2 as shown in FIG. 1. In the case of the preferred embodiment shown in FIG. 1, the characteristic of the transmission coefficient $S_{21}$ scarcely changes even when the coupling length L is larger than (½)λg.

In order to change the width w, the interval t or the coupling length L, by changing the conductor width or the conductor length of the microstrip conductor to be formed for the adjustment in the process of manufacturing the microwave circuit 201 or by etching a part of the formed microstrip conductor, for example, in a chemical manner, the conductor width or the conductor length can be changed for the adjustment. By changing these parameters, the coupling coefficient M is changed to change the transmission coefficient $S_{21}$, thereby allowing the amount of attenuation to be changed in the transmission mode and the attenuation mode.

As described above, the present preferred embodiment can switch between transmission, attenuation or interruption of the microwave signal from the port P1 to the port P2, as a consequence of which the amount of attenuation is larger in the off state than in the prior art. The microwave circuit 201 of the present preferred embodiment does not require a manufacturing process of high accuracy, and therefore, the circuit can be easily manufactured at low cost. Furthermore, the circuit requires neither an input nor output matching circuit such as the quarter-wave plates 152, 153 and 154 or the like, as compared with the prior art, and therefore, the circuit can be more compact and reduced in weight.

Second Preferred Embodiment

Figure 5:
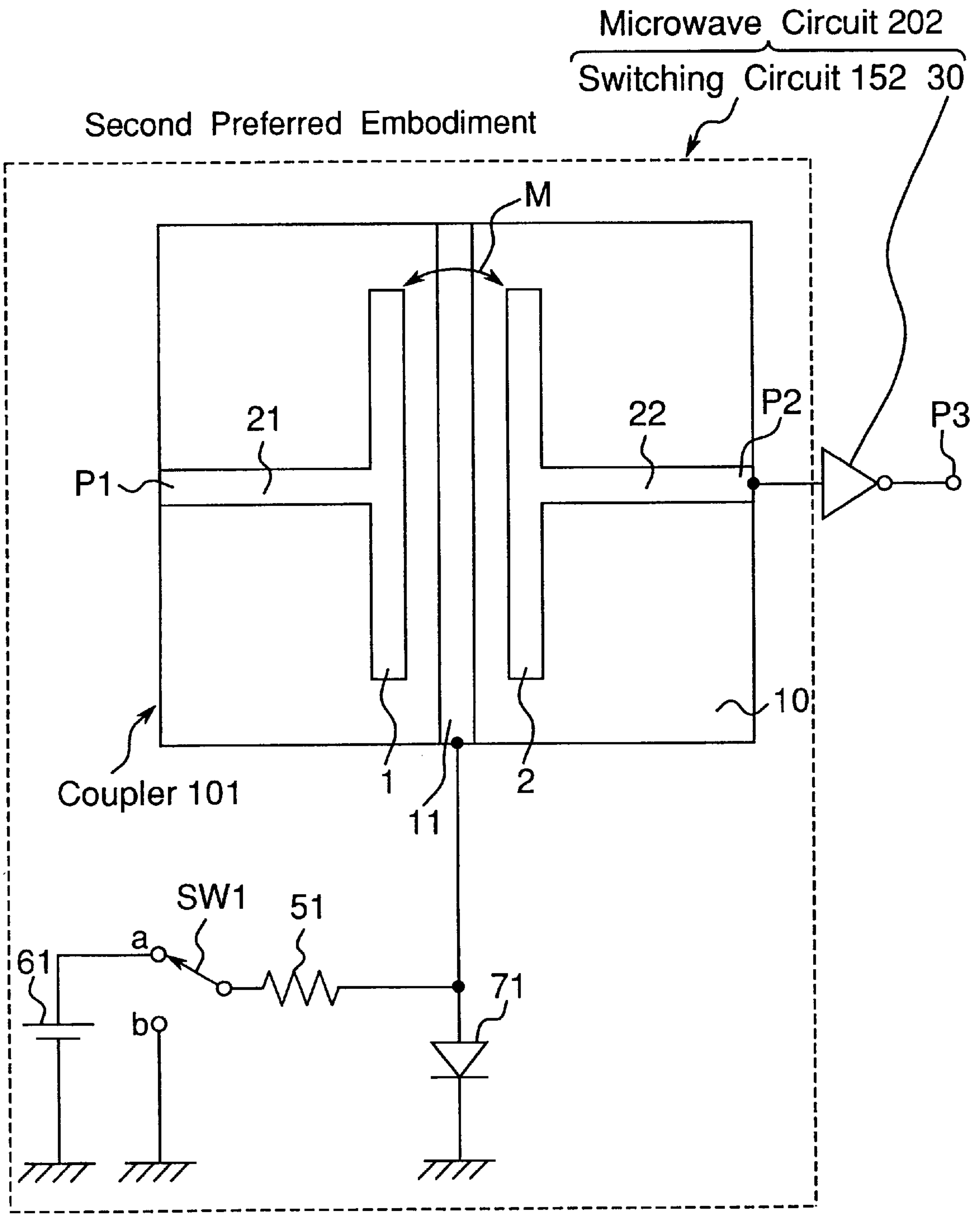
FIG. 5 is a plan view and circuit diagram showing a construction of a microwave circuit according to a second preferred embodiment of the present invention.

FIG. 5 is a block diagram and circuit diagram showing a construction of a microwave circuit 202 according to a second preferred embodiment of the present invention. In FIG. 5, the same components as those of FIG. 1 are denoted by the same reference numerals. In a switching circuit 152 of the microwave circuit 202 of the present preferred embodiment, the FET 41 is replaced by a diode 71 as compared with the switching circuit 151 of the first preferred embodiment shown in FIG. 1.

In this case, one end of the floating conductor 11 is connected to the anode of the diode 71, while the cathode of the diode 71 is grounded. The anode of the diode 71 is connected to the common terminal of the switch SW1 via a resistor 51.

If the switch SW1 is switched to the contact "a" side in the switching circuit 152 constructed as above, then the diode 71 is turned on, so the floating conductor 11 is grounded and has the ground potential. In this stage, the-switching circuit 152 is put in a microwave signal transmitting state. If the switch SW1 is switched to the contact "b" side, then the diode 71 is turned off, and the floating conductor 11 has a floating potential other than the ground potential. In this stage, the switching circuit 152 is put in a microwave signal attenuating or interrupting state. Therefore, the present preferred embodiment has an operation and an effect similar to those of the first preferred embodiment.

The switching circuit 152 provided with the diode 71 of the present preferred embodiment can be applied to not only the first preferred embodiment but also the third to seventh preferred embodiments as described later.

Third Preferred Embodiment

Figure 6:
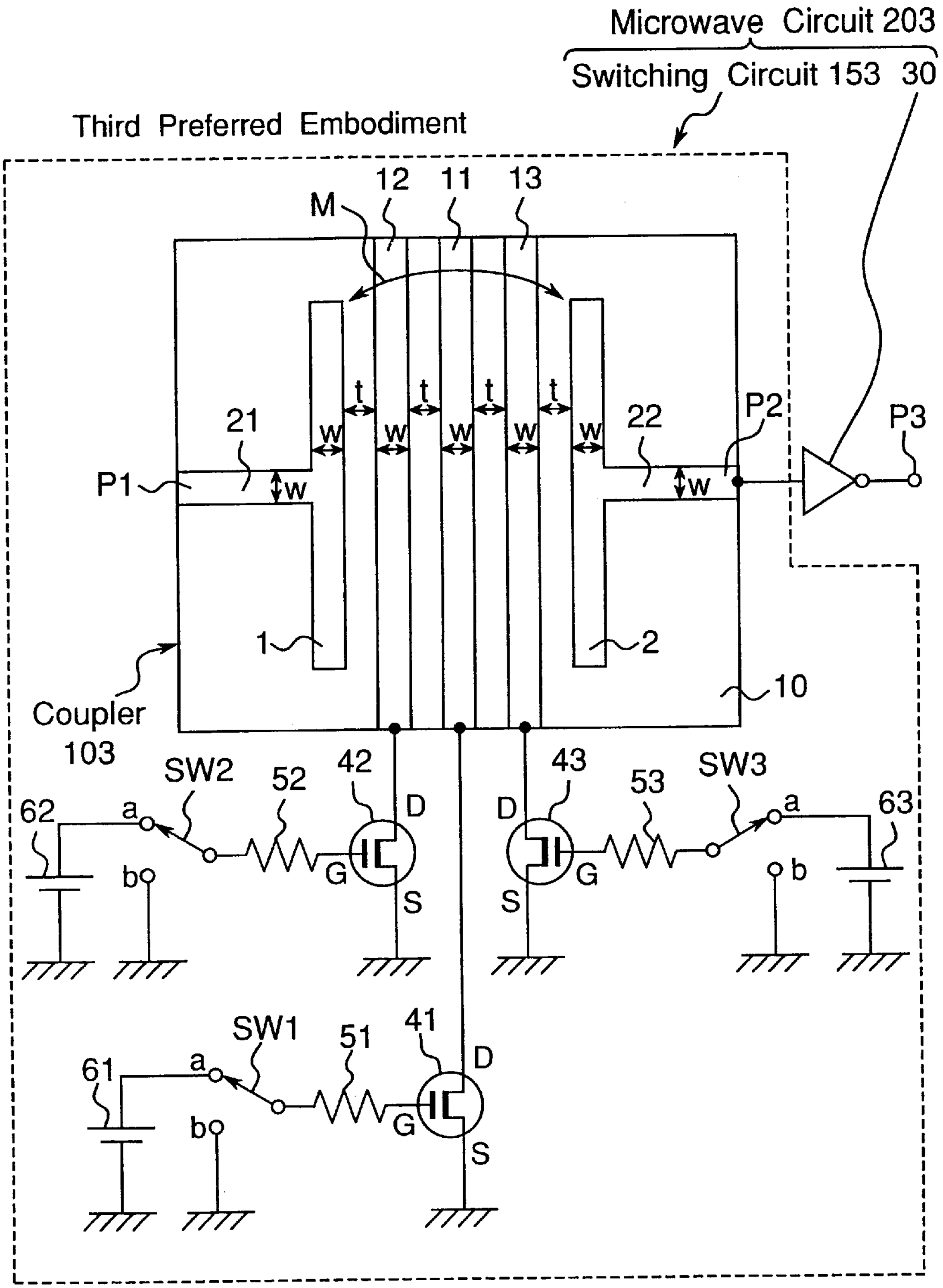
FIG. 6 is a plan view and circuit diagram showing a construction of a microwave circuit according to a third preferred embodiment of the present invention.

FIG. 6 is a circuit diagram showing a construction of a microwave circuit 203 according to a third preferred embodiment of the present invention. In FIG. 6, the same components as those of FIG. 1 and FIG. 5 are denoted by the same reference numerals. The microwave circuit 203 of the present preferred embodiment is provided with a switching circuit 153 and the amplifier 30.

Referring to FIG. 6, the switching circuit 153 comprises the following:

(a) a coupler 103 provided with two microstrip conductors 1 and 2 which are formed on a dielectric substrate 10 having a rear surface on which a grounding conductor is formed, to be adjacently arranged parallel to each other so as to be electromagnetically coupled with each other, and three floating conductors 11, 12 and 13 which are interposed at identical intervals t between the microstrip conductors 1 and 2 and arranged parallel to the microstrip conductors 1 and 2; and (b) source-grounded FETs 41, 42 and 43 for effecting switchover between connection and disconnection of one end of each of the floating conductors 11, 12 and 13 to the ground.

In the switching circuit 153 shown in FIG. 6, one end of the floating conductor 11 is grounded via the drain and source of the FET 41, while the gate of the FET 41 is connected to the DC power source 61 or the ground potential via the resistor 51 and the switch SW1 similar to the case of FIG. 1. One end of the floating conductor 12 is grounded via the drain and the source of an FET 42, while the gate of the FET 42 is connected to the DC power source 62 or the ground potential via a resistor 52 and a switch SW2 similar to the FET 41. Further, one end of the floating conductor 13 is grounded via the drain and the source of an FET 43, while the gate of the FET 43 is connected to the DC power source 63 or the ground potential via a resistor 53 and a switch SW3 similar to the FET 41.

In the switching circuit 153 constructed as above, by grounding one, two or three of the floating conductors 11, 12 and 13 or by grounding none of them, the coupling coefficient M of the microstrip conductor 1 and the microstrip conductor 2 can be changed. With this arrangement, when a microwave signal is inputted to the port P1, the amount of attenuation of the microwave signal appearing at the port P2 can be changed. It is to be noted that the coupler 103 is a reversible circuit.

Figure 7:
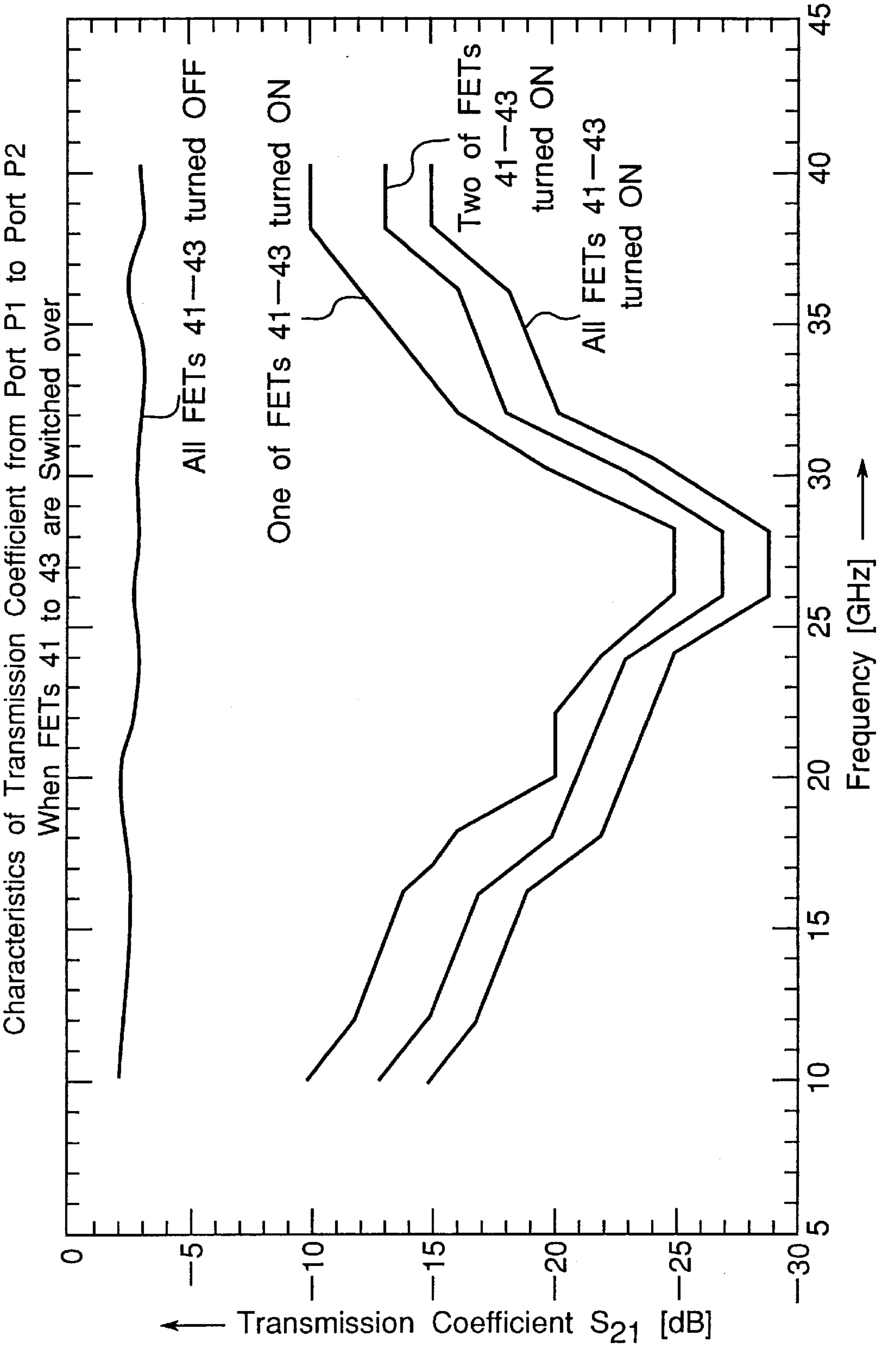
FIG. 7 is a graph showing characteristics of a transmission coefficient from the port P1 to the port P2 in the case where FETs are turned on and off by the switching circuit of FIG. 6, and representing a relation between the transmission coefficient $S_{21}$ [dB] and frequency [GHz]

FIG. 7 is a graph showing characteristics of a transmission coefficient from the port P1 to the port P2 in the case where FETs 41, 42 and 43 are switched and turned on and off in the switching circuit 153 of FIG. 6, and representing a relation between a transmission coefficient $S_{21}$ (dB) and the inputted microwave frequency (GHz). As is apparent from FIG. 7, it can be found that the transmission coefficient $S_{21}$ has an amount of attenuation of about −3 dB over all the frequency regions of the inputted microwave when all of the FETs 41, 42 and 43 are turned off. In contrast to this, if one of the FETs 41, 42 and 43 is turned on, then the transmission coefficient $S_{21}$ becomes about −25 dB at, for example, a blocking frequency of 27 GHz. If two of the FETs 41, 42 and 43 are turned on, then the transmission coefficient $S_{2}$, becomes about −27 dB in, for example, the blocking frequency of 27 GHz. If all of the FETs 41, 42 and 43 are turned on, then the transmission coefficient $S_{21}$ becomes about −29 dB at, for example, the blocking frequency of 27 GHz. As is apparent from FIG. 7, the frequency band in the attenuation mode is a relatively wide band including the aimed frequency. That is, the microwave signal can be attenuated throughout the relatively wide band, and the amount of attenuation can be stepwise changed.

According to the present preferred embodiment described as above, by appropriately turning on or off the FETs 41, 42 and 43 by the above-mentioned effect, the amount of attenuation of the inputted microwave through the path from the port P1 to the port P2 is stepwise changed for the adjustment, so that the microwave circuit 203 including the switching circuit 153 can be used as an attenuator. The microwave circuit 203 of the present preferred embodiment does not require a manufacturing process of high accuracy, and therefore, the circuit can be easily manufactured at low cost. Furthermore, the circuit requires neither an input nor an output matching circuit such as the quarter-wave plates 152, 153 and 154 or the like as compared with the prior art, and therefore, the circuit can be more compact and reduced in weight.

Although the three floating conductors 11, 12 and 13 are formed in the present preferred embodiment, the number of the floating conductors is not limited to this, and two or four or more floating conductors may be provided.

Fourth Preferred Embodiment

Figure 8:
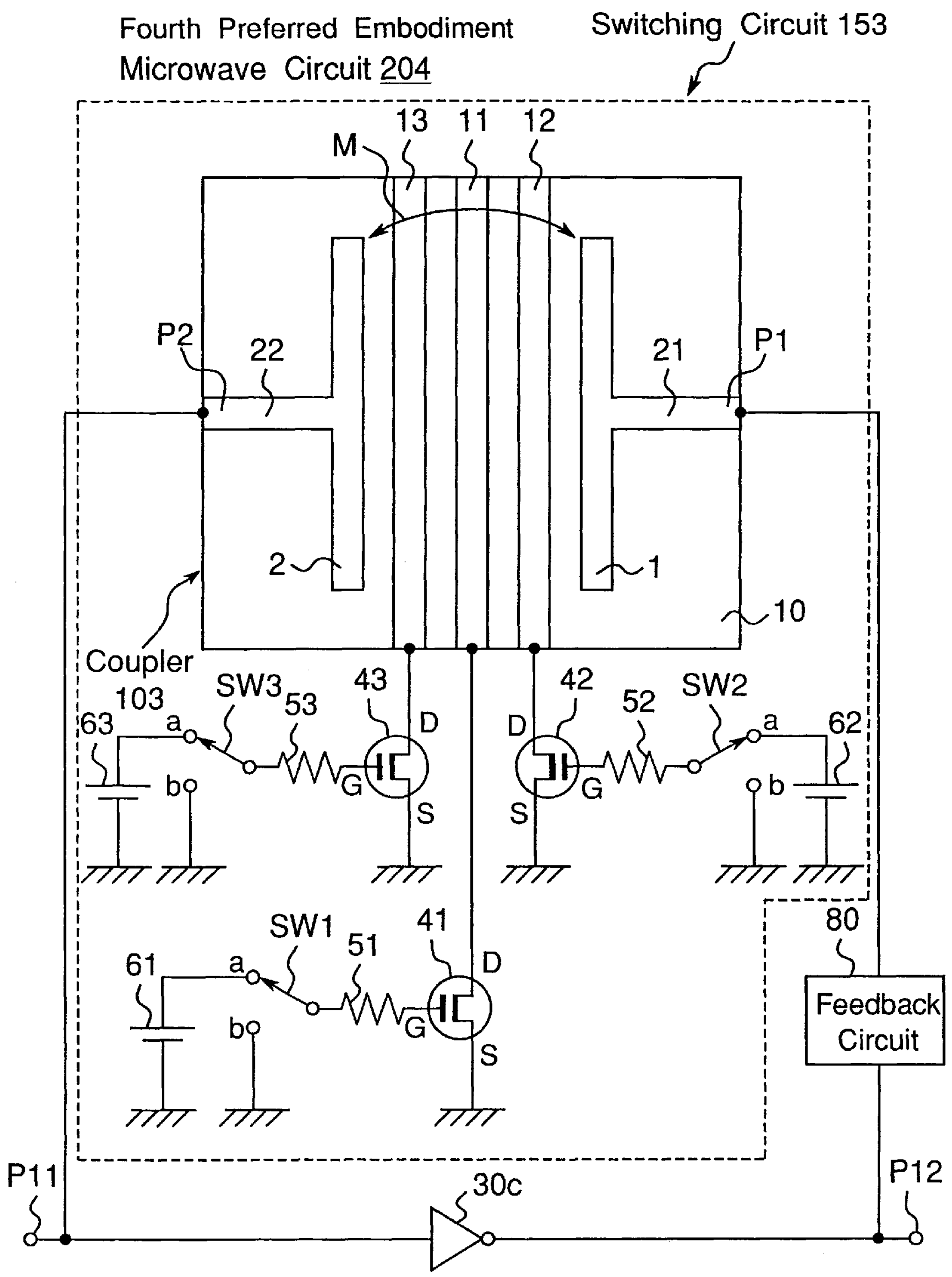
FIG. 8 is a plan view and circuit diagram showing a construction of a microwave circuit according to a fourth preferred embodiment of the present invention.

FIG. 8 is a plan view and circuit diagram showing a construction of a microwave circuit 204 according to a fourth preferred embodiment of the present invention. In FIG. 8, the same components as those of FIG. 1, FIG. 5 and FIG. 7 are denoted by the same reference numerals. The microwave circuit 204 of the present preferred embodiment is includes an amplifier 30*c* that serves as an inverting amplifier and a feedback circuit 80 in addition to the switching circuit 153 of the third preferred embodiment, for the provision of a negative feedback type amplifier circuit.

Referring to FIG. 8, an input port P11 is connected to an output port P12 via the amplifier 30*c*, and the output port P12 is connected to the input port P11 via the feedback circuit 80 comprised of a transmission line having a predetermined length and the ports P1 and P2 of the switching circuit 153. In this case, the circuit extending from the output port P12 via the feedback circuit 80 and the switching circuit 153 to the input port P11 constitutes a negative feedback path in the present microwave circuit 204, and the microwave circuit 204 totally constitutes a negative feedback type amplifier circuit. That is, the negative feedback path is constructed by connecting in series the coupler 103 of the switching circuit 153 and the feedback circuit 80.

In the microwave circuit 204 constructed as above, the amount of attenuation of the switching circuit 153 can be changed as in the third preferred embodiment, by which the amount of negative feedback of the negative feedback type amplifier circuit can be changed, therefore allowing the amplification degree of the negative feedback type amplifier circuit to be changed.

According to the present preferred embodiment described as above, by using the switching circuit 153 capable of attenuating the microwave signal in a relatively wide band and changing the amount of attenuation for the negative feedback circuit, the negative feedback type amplifier circuit capable of changing the amplification degree in the relatively wide band can be constructed. The microwave circuit 204 of the present preferred embodiment does not require a manufacturing process of high accuracy, and therefore, the circuit can be easily manufactured at low cost. Furthermore, the circuit requires neither an input nor output matching circuit such as the quarter-wave plates 152, 153 and 154 or the like as compared with the prior art, and therefore, the circuit can be more compact and reduced in weight.

Fifth Preferred Embodiment

Figure 9:
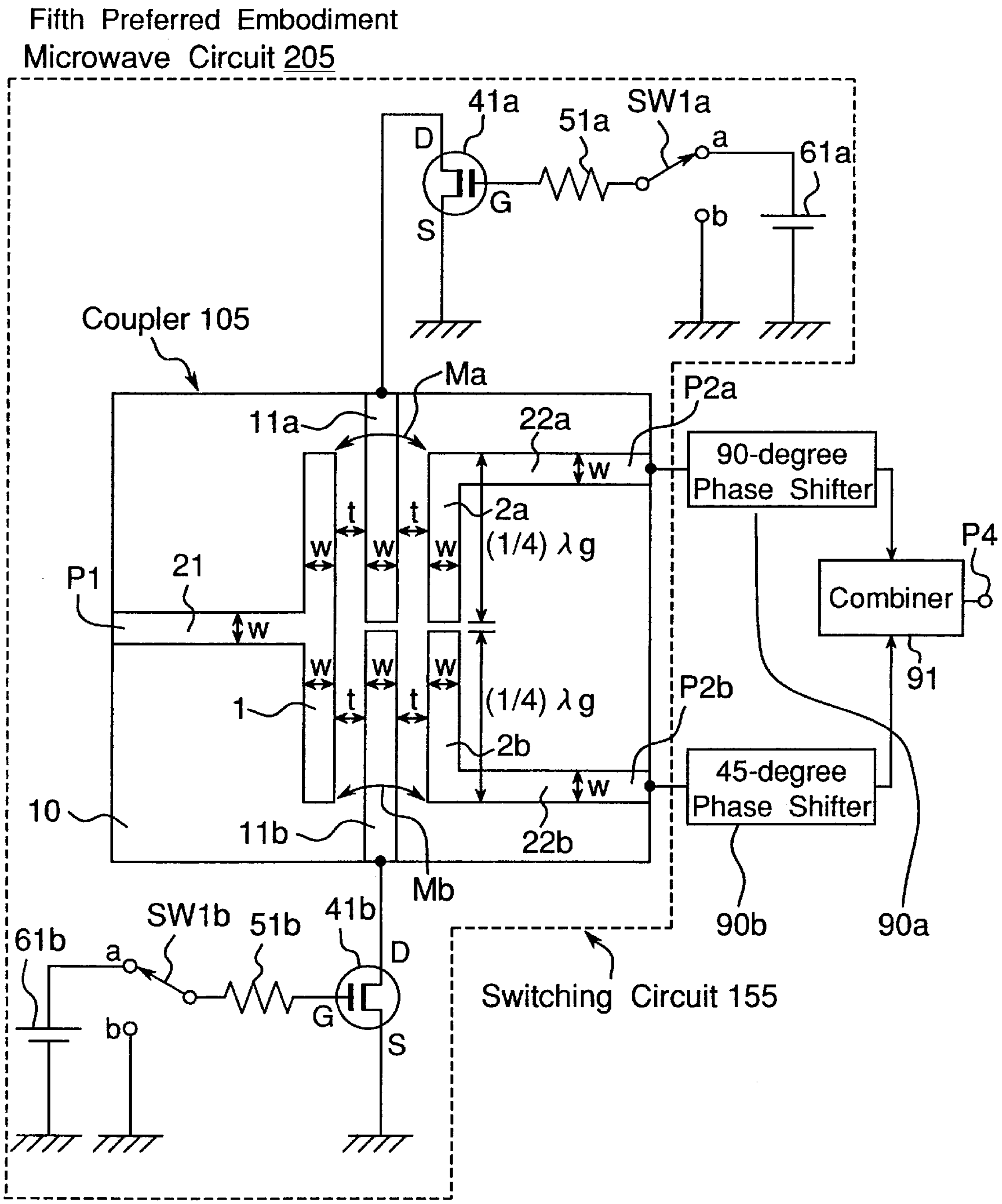
FIG. 9 is a plan view and circuit diagram showing a construction of a microwave circuit according to a fifth preferred embodiment of the present invention.

FIG. 9 is a plan view and circuit diagram showing a construction of a microwave circuit 205 according to a fifth preferred embodiment of the present invention. In FIG. 9, the same components as those of FIG. 1, FIG. 5, FIG. 7 and FIG. 8 are denoted by the same reference numerals. The microwave circuit 205 of the present preferred embodiment is provided with a switching circuit 155, a 90-degree phase shifter 90*a* and a 45-degree phase shifter 90*b*, constituting a phase shift amount switchover type phase shifter circuit.

In the switching circuit 155 shown in FIG. 9, the microstrip conductor 2 shown in FIG. 1 is cut and divided into two microstrip conductors 2*a* and 2*b* at the middle point in the lengthwise direction and the floating conductor 11 shown in FIG. 1 is cut and divided into two floating conductors 11*a* and 11*b* at the middle point in the lengthwise direction as compared with the switching circuit 151 shown in FIG. 1. That is, the two microstrip conductors 2*a* and 2*b* each having a length of (¼)λg are formed adjacently in a straight line so as to be electromagnetically coupled with the microstrip conductor 1. The floating conductor 11*a* is formed so as to be interposed between one half portion of the microstrip conductor 1 and the microstrip conductor 2*a* and arranged parallel to the two microstrip conductors 1 and 2*a*. The floating conductor 11*b* is formed so as to be interposed between the other half portion of the microstrip conductor 1 and the microstrip conductor 2*b* and arranged parallel to the two microstrip conductors 1 and 2*b*. In this case, an interval between the floating conductors 11*a* and 11*b* and the microstrip conductor 1 as well as an interval between the floating conductors 11*a* and 11*b* and the microstrip conductor 2 are each set to an identical interval t. The microstrip conductors 1, 2*a* and 2*b* and the floating conductors 11*a* and 11*b* have a predetermined identical width w.

Further, a microstrip conductor 21 that has a width w and extends from the middle point of the microstrip conductor 1 to the approximate middle point of one side of the dielectric substrate 10 is formed on the dielectric substrate 10, and the end portion on the approximate middle point side of the one side of the dielectric substrate 10 is made to serve as the port P1. A microstrip conductor 22*a* that has a width w and extends from the outside end of the microstrip conductor 2*a* to a predetermined position of one side of the dielectric substrate 10 opposite to the one side of the port P1 is formed on the dielectric substrate 10, and the end portion on the one side of the dielectric substrate 10 is made to serve as a port P2*a*. In this case, the outside means the side facing the vicinity of the periphery of the dielectric substrate 10. Further, a microstrip conductor 22*b* that has a width w and extends from the outside end of the microstrip conductor 2*b* to a predetermined position of one side of the dielectric substrate 10 opposite to the one side of the port P1 is formed on the dielectric substrate 10, and the end portion on the one side of the dielectric substrate 10 is made to serve as a port P2*b*.

In this case, the microstrip conductor 1 and the grounding conductor 15 constitute a microstrip line, the microstrip conductor 2*a* and the grounding conductor 15 constitute a microstrip line and the microstrip conductor 2*b* and the grounding conductor 15 constitute a microstrip line. The microstrip conductor 21 and the grounding conductor 15 constitute a microstrip line, the microstrip line 22*a* and the grounding conductor 15 constitute a microstrip line and the microstrip line 22*b* and the grounding conductor 15 constitute a microstrip line. In this case, the microstrip conductor 1 and the microstrip conductor 2*a* are electromagnetically coupled with each other via the floating conductor 11*a* with a coupling coefficient Ma, while the microstrip conductor 1 and the microstrip conductor 2*b* are electromagnetically coupled with each other via the floating conductor 11*b* with a coupling coefficient Mb. As described above, a coupler 105 having the port P1 and the ports P2*a* and P2*b* is formed.

The outside end of the floating conductor 11*a* is grounded via the drain and source of an FET 41*a*, while the gate of the FET 41*a* is connected to a DC power source 61*a* or the ground potential via a DC voltage applying resistor 51*a* having a relatively great resistance value and a switch SW1*a*. The outside end of the floating conductor 11*b* is grounded via the drain and source of an FET 41*b*, while the gate of the FET 41*b* is connected to a DC power source 61*b* or the ground potential via a DC voltage applying resistor 51*b* having a relatively great resistance value and a switch SW1*b*.

In this case, the coupler 105, the FET 41*a*, the peripheral circuit of the FET, the FET 41*b* and the peripheral circuit of the FET constitute the switching circuit 155. The port P2*a* of the coupler 101 is connected to a port P4 via the 90-degree phase shifter 90*a* for shifting the inputted microwave signal by 90 degrees and a combiner 91, while the port P2*b* of the coupler 101 is connected to the port P4 via the 45-degree phase shifter 90*b* for shifting the inputted microwave signal by 45 degrees and the combiner 91. In this case, the combiner 91 combines signals outputted from the phase shifters 90*a* and 90*b*, and then outputs the resulting signal to the port P4.

If the switch SW1*a* is switched over to the contact "b" side and the switch SW1*b* is switched over to the contact "a" side in the switching circuit 151 constructed as above, then the FET 41*a* is turned off and the FET 41*b* is turned on. Therefore, in this case, the floating conductor 11*a* becomes a floating potential, while the floating conductor 11*b* is grounded to have the ground potential, when Ma>Mb. As is apparent from the operation of the first preferred embodiment and the experimental example, the microwave signal inputted to the port P1. is outputted from the microstrip conductor 1 to the port P2*a* via the microstrip conductor 2*a* and the combiner 91. However, almost no output is formed at the port P2*b* from the microstrip conductor 1 via the microstrip conductor 2*b* and the combiner 91 due to a relatively great amount of attenuation.

When the switch SW1*a* is switched over to the contact "a" side and the switch SW1*b* is switched over to the contact "b" side, the FET 41*a* is turned on and the FET 41*b* is turned off. Therefore, in this case, the floating conductor 11*a* is grounded to have the ground potential, while the floating conductor 11*b* becomes a floating potential, when Mb>Ma. As is apparent from the operation of the first preferred embodiment and the experimental example, the microwave signal inputted to the port P1 is outputted from the microstrip conductor 1 to the port P2*b* via the microstrip conductor 2*b*. However, almost no output is formed at the port P2*a* from the microstrip conductor 1 via the microstrip conductor 2*a* due to a relatively great amount of attenuation.

Therefore, the switching circuit 155 constitutes a selection type switch circuit for selectively connecting the port P1 to the port P2*a* or the port P2*b*. That is, when a predetermined load is connected to the port P4 and when the switch SW1*a* is switched over to the contact "b" side and the switch SW1*b* is switched over to the contact "a" side in the switching circuit 151, the microwave signal inputted to the port P1 is outputted to the port P4 via the switching circuit 155 and the 90-degree phase shifter 90*a*. When the switch SW1*a* is switched over to the contact "a" side and the switch SW1*b* is switched over to the contact "b" side, the microwave signal inputted to the port P1 is outputted to the port P4 via the switching circuit 155 and the 45-degree phase shifter 90*b*. Therefore, the microwave circuit 205 constitutes a phase shift amount switchover type phase shifter circuit capable of selectively switching the amount of phase shift to 90 degrees or 45 degrees. It is to be noted that the coupler 105 is a reversible circuit.

As described above, according to the microwave circuit 205 of the present preferred embodiment, a selection type switch circuit can be constituted by the switching circuit

155, and the phase shift amount switchover type phase shifter circuit capable of selectively switching the amount of phase shift to 90 degrees or 45 degrees can be constituted by the switching circuit 155. This phase shift circuit has a relatively wide band and the effect that the amount of attenuation in the off state is relatively great. The microwave circuit 205 of the present preferred embodiment does not require a manufacturing process of high accuracy, and therefore, the circuit can be easily manufactured at low cost. Furthermore, the circuit requires neither an input and output matching circuit such as the quarter-wave plates 152, 153 and 154 nor the like as compared with the prior art, and therefore, the circuit can be more compacted and reduced in weight.

Although one floating conductor 11*a* is interposed between the microstrip conductor 1 and the microstrip conductor 2*a*, the present invention is not limited to this, and a plurality of floating conductors may be formed similar to the third and fourth preferred embodiments. With this arrangement, the amount of attenuation in the cutoff stage effected between the port P1 and the port P2*a* can be changed. Although one floating conductor 11*b* is interposed between the microstrip conductor 1 and the microstrip conductor 2*b*, the present invention is not limited to this, and a plurality of floating conductors may be formed similar to the third and fourth preferred embodiments. With this arrangement, the amount of attenuation in the cutoff stage effected between the port P1 and the port P2*b* can be changed.

Although the 90-degree phase shifter 90*a* and the 45-degree phase shifter 90*b* are employed as a phase shifter in the above preferred embodiment, the present invention is not limited to these amounts of phase shift.

Sixth Preferred Embodiment

Figure 10:
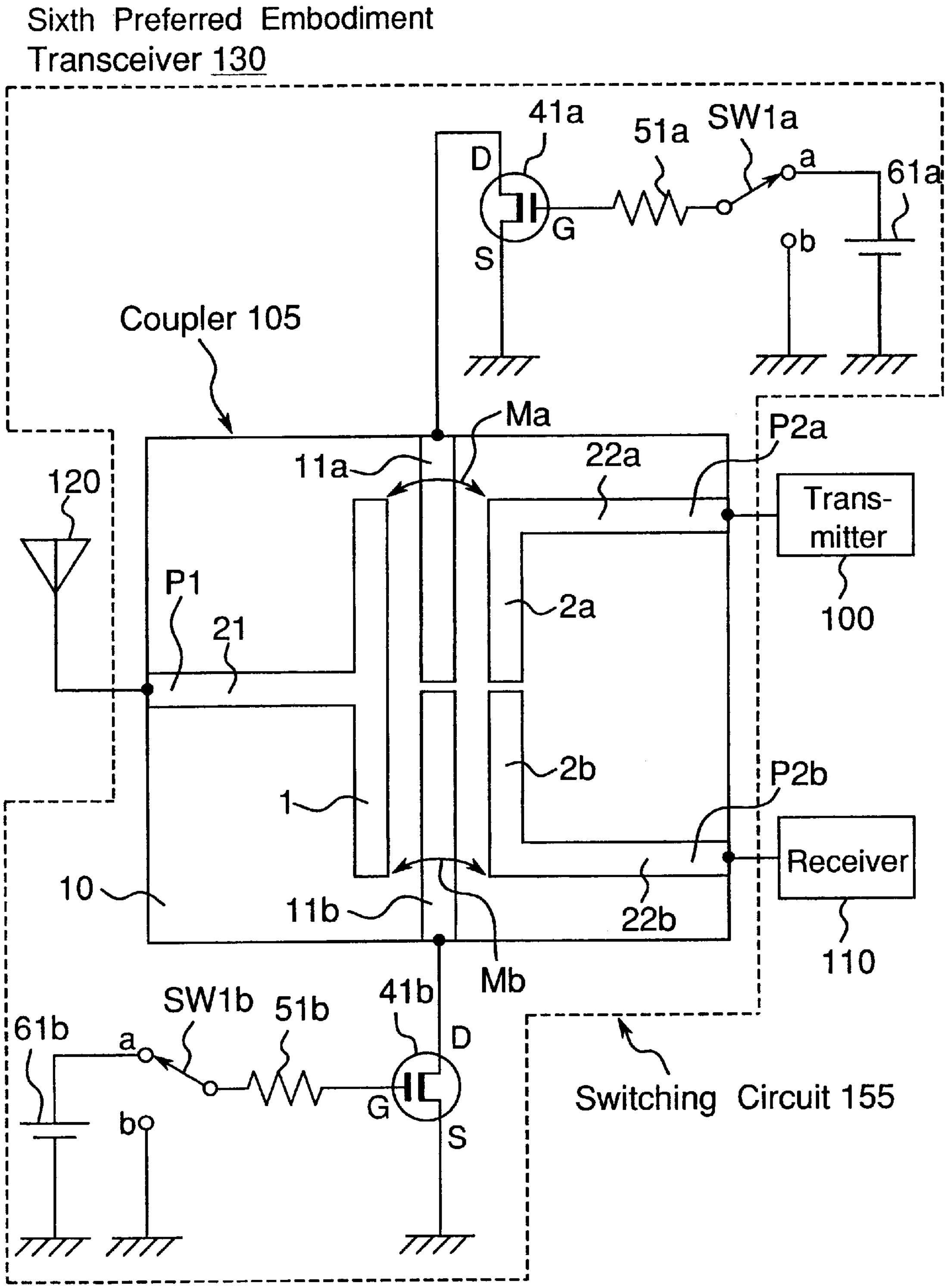
FIG. 10 is a plan view and circuit diagram showing a construction of a transceiver according to a sixth preferred embodiment of the present invention.

FIG. 10 is a circuit diagram showing a construction of a transceiver 130 according to a sixth preferred embodiment of the present invention. In FIG. 10, the same components as those of FIGS. 1, 5, 7, 8 and 9 are denoted by the same reference numerals. The transceiver 130 of the present preferred embodiment includes the switching circuit 155 of the fifth preferred embodiment used as a transmission and reception switchover circuit. The point different from the fifth preferred embodiment shown in FIG. 9 will be described in detail.

Referring to 10, a transmitter 100 is connected to the port P2*a* of the switching circuit 155, a receiver 110 is connected to the port P2*b* of the switching circuit 155, and an antenna 120 is connected to the port P1 of the switching circuit 155.

When the switch SW1*a* is switched over to the contact "b" side and the switch SW1*b* is switched over to the contact "a" side in the transceiver 130 constructed as above, the antenna 120 is connected to the transmitter 100 via the switching circuit 155. In this stage, a microwave transmission signal transmitted from the transmitter 100 is outputted to the antenna 120 via the switching circuit 155 and radiated. When the switch SW1*a* is switched over to the contact "a" side and the switch SW1*b* is switched over to the contact "b" side, the antenna 120 is connected to the receiver 110 via the switching circuit 155. A microwave reception signal received by the antenna 120 is outputted to the receiver 110 via the switching circuit 155 and received by the receiver 110.

According to the transceiver 130 of the present preferred embodiment described as above, the switching circuit 155 can constitute a transmission and reception switchover switch circuit. This switch circuit has a relatively wide band and the effect that the amount of attenuation in the off state is relatively great. The transceiver 130 of the present preferred embodiment does not require a manufacturing process of high accuracy, and therefore, the transceiver can be easily manufactured at low cost. Furthermore, the transceiver requires neither an input and output matching circuit such as the quarter-wave plates 152, 153 and 154 nor the like as compared with the prior art, and therefore, the circuit can be more compacted and reduced in weight.

Seventh Preferred Embodiment

Figure 11:
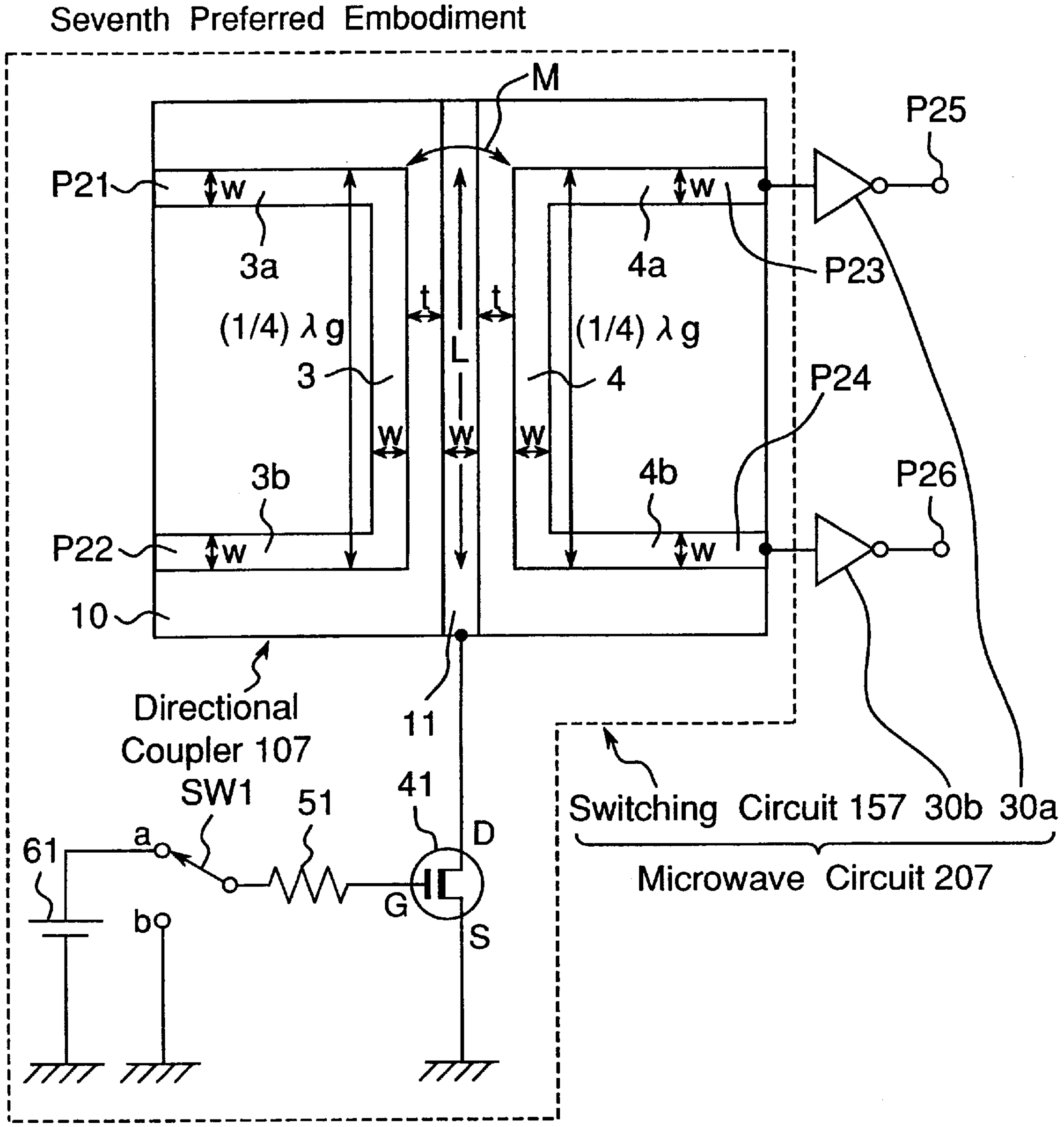
FIG. 11 is a plan view and circuit diagram showing a construction of a switching circuit according to a modified preferred embodiment of the present invention.
Figure 12:
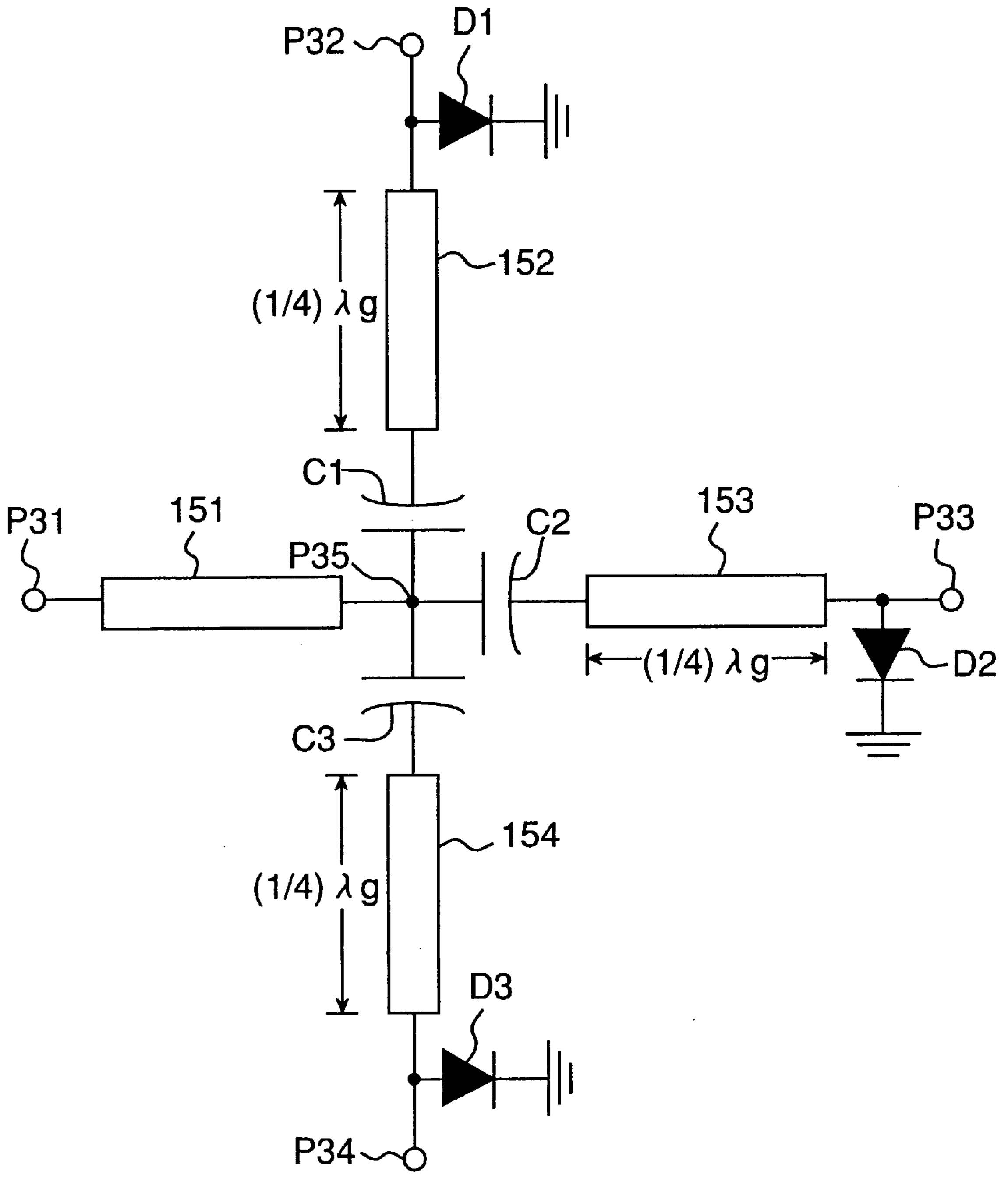
Fig.12 PRIOR ART
FIG. 12 is a circuit diagram showing a construction of a prior art microwave switching circuit.

FIG. 11 is a circuit diagram showing a construction of a microwave circuit 207 according to a seventh preferred embodiment of the present invention. In FIG. 11, the same components as those of FIG. 1 are denoted by the same reference numerals. The microwave circuit 207 of the present preferred embodiment is provided with a switching circuit 157 and two amplifiers 30*a* and 30*b*. In this case, two microstrip conductors 3 and 4 that are electromagnetically coupled with each other and a floating conductor 11 shown in FIG. 1 constitute a directional coupler 107, while the directional coupler 107, the FET 41 for setting the floating conductor 11 to the ground potential or a floating potential and its peripheral circuit constitute the switching circuit 207. In this case, the two microstrip conductors 3 and 4 constitute a quarter-wave coupled-line type directional coupler. The switching circuit 157 of the present preferred embodiment can be applied to the above-mentioned first to fourth preferred embodiments. That is, the above-mentioned couplers 100, 101 and 103 may be replaced by the directional coupler 107.

In the switching circuit 157 shown in FIG. 11, the two microstrip conductors 3 and 4 are adjacently arranged parallel to each other so as to be electromagnetically coupled with each other and formed on the dielectric substrate 10 having a rear surface on which a grounding conductor is formed, and each of the microstrip conductors 3 and 4 has a length of (¼)λg and a width w. In this case, λg is the guide wavelength. Then, the floating conductor 11 is formed so as to be interposed between the two the microstrip conductors 3 and 4 and arranged parallel to the two microstrip conductors 3 and 4 on the dielectric substrate 10, and the floating conductor 11 has a length longer than (¼)λg and the width w. In this case, an interval between the floating conductor 11 and the microstrip conductor 3 and an interval between the floating conductor 11 and the microstrip conductor 4 are each set to an identical interval t.

Further, a microstrip conductor 3*a* that has a width w and extends from one end in the lengthwise direction of the microstrip conductor 3 to an end portion of one side of the dielectric substrate 10 is formed on the dielectric substrate 10, and the end portion of the one side of the dielectric substrate 10 is made to serve as a port P21. A microstrip conductor 3*b* that has a width w and extends from the other end in the lengthwise direction of the microstrip conductor 3 to the other end portion of one side of the dielectric substrate 10 is formed on the dielectric substrate 10, and the other end portion of the one end of the dielectric substrate 10 is made to serve as a port P22. Further, a microstrip conductor 4*a* that has a width w and extends from one end in the lengthwise direction of the microstrip conductor 4 to one side (referred to as the opposite one side hereinafter) opposite to the above one side of the dielectric substrate 10 is formed on the dielectric substrate 10, and the end portion of the opposite one side of the dielectric substrate 10 is made to serve as a port P23. A microstrip conductor 4*b* that has a width w and extends from the other end in the lengthwise direction of the microstrip conductor 4 to the other end portion of the opposite one side of the dielectric substrate 10 is formed on the dielectric substrate 10, and the other end portion of the opposite one side of the dielectric substrate 10 is made to serve as a port P24.

In this case, the microstrip conductor 3 and the grounding conductor 15 constitute a microstrip line, while the microstrip conductor 4 and the grounding conductor 15 constitute a microstrip line. The microstrip conductor 3*a* and the grounding conductor 15 constitute a microstrip line, while the microstrip conductor 3*b* and the grounding conductor 15 constitute a microstrip line. Further, the microstrip conductor 4*a* and the grounding conductor 15 constitute a microstrip line, while the microstrip conductor 4*b* and the grounding conductor 15 constitute a microstrip line. In this case, the microstrip conductor 3 and the microstrip conductor 4 are electromagnetically coupled with each other with a coupling coefficient M and a coupling length L via the floating conductor 11. In this case, the coupling length L is the length in the lengthwise direction of the floating conductor 11 effective for the electromagnetic coupling of the microstrip conductors 3 and 4. In a manner as described above, the quarter-wave coupled-line type directional coupler 107 having the four ports P21, P22, P23 and P24 and the floating conductor 11 is formed.

One end of the floating conductor 11 is connected to the drain of the FET 41, while the source of the FET 41 is grounded. The gate of the FET 41 is connected to the common terminal of the switch SW1 via the DC voltage applying resistor 51 having a relatively great resistance value. On the other hand, the contact "a" of the switch SW1 is connected to the positive pole of the DC power source 61 having a predetermined DC voltage, while the contact "b" of the switch SW1 is grounded. In this case, the negative pole of the DC power source 61 is grounded.

In this case, the directional coupler 107, the FET 41 and its peripheral circuit constitute a switching circuit 157. The port P23 of the directional coupler 107 is connected to a port P25 via the amplifier 30*a* that is an inverting amplifier. The port P24 of the directional coupler 107 is connected to a port P26 via the amplifier 30*b* that is an inverting amplifier. In this case, the switching circuit 157 and the amplifiers 30*a* and 30*b* constitute a microwave circuit 207 that is an amplifier circuit capable of switching between amplification and attenuation as described later.

If the switch SW1 is switched over to the contact "a" side in the switching circuit 157 constructed as above, then a predetermined positive DC voltage is applied to the gate of the FET 41, by which the FET 41 is turned on and the floating conductor 11 is grounded to have the ground potential. If the switch SW1 is switched over to the contact "b" side, then the gate of the FET 41 is grounded, by which the FET 41 is turned off and the floating conductor 11 becomes a floating potential other than the ground potential.

In this case, if a microwave signal is inputted to the port P21 when the port P22 is terminated and the ports P25 and P26 are terminated with respective predetermined loads and the FET 41 is turned off, then the microstrip conductor 3 is electromagnetically coupled with a greater coupling coefficient M with the microstrip conductor 4 via the floating conductor 11 having the floating potential. Therefore, the inputted microwave signal is outputted from the microstrip conductor 3 to the microstrip conductors 4*a* and 4*b* via the floating conductor 11 and the microstrip conductor 4 and further outputted to the port P25 via the port P23 and the amplifier 30*a* and to the port P26 via the port P24 and the amplifier 30*b*. The floating conductor 11 is grounded when the FET 41 is turned on, and therefore, the degree of electromagnetic coupling, or the coupling coefficient of the microstrip conductor 3 with the microstrip conductor 4 becomes smaller than when the FET 41 is turned off. When a microwave signal having a predetermined blocking frequency is inputted to the port P21, the inputted microwave signal is inputted to the microstrip conductor 3 and attenuated by the floating conductor 11. Consequently, a microwave signal attenuated by a predetermined amount of attenuation is outputted from the microstrip conductor 4 and outputted to the port P25 via the port P23 and the amplifier 30*a* and to the port P26 via the port P24 and the amplifier 30*b*. In this case, when the amount of attenuation is extremely great, the inputted microwave signal is scarcely outputted to the ports P23 and P24.

An operation similar to the above is achieved also in the case where a microwave signal is inputted to the port P22 when, for example, the port P21 is terminated and the ports P25 and P26 are terminated with respective predetermined loads. It is to be noted that the directional coupler 107 is a reversible circuit.

As described above, the present preferred embodiment can execute switching between the transmission, the attenuation or the interruption of the microwave signal from the port P21 or P22 to the port P23 or P24, and the amount of attenuation in the off-state is greater than in the prior art. In the absence of the amplifiers 30*a* and 30*b*, it is allowed to execute switching between the transmission, the attenuation or the interruption of the microwave signal from the port P23 or P24 to the port P21 or P22. The microwave circuit 207 of the present preferred embodiment does not require a manufacturing process of high accuracy, and therefore, the circuit can be easily manufactured at low cost. Furthermore, the circuit requires neither an input and output matching circuit such as the quarter-wave plates 152, 153 and 154 nor the like as compared with the prior art, and therefore, the circuit can be more compacted and reduced in weight.

Modified Preferred Embodiments

Although the dielectric substrate 10 is employed in the above preferred embodiments and the above modified preferred embodiments, the present invention is not limited to this, and a semiconductor substrate may be employed.

In the above preferred embodiments and the above modified preferred embodiment, the switching device such as the FETs 41, 42 and 43 or the diode 71 is connected to one end of the floating conductors 11, 12 and 13 for the switching to ground or not to ground the one end. However, the present invention is not limited to this, and it is acceptable to connect the switching device to both the ends of the floating conductors 11, 12 and 13 for the switching to ground or not to ground both the ends. In this case, it is acceptable to connect the switching device such as the FETs 41, 42 and 43 or the diode 71 as a hybrid device on the dielectric substrate 10 or form the device or the elements on a semiconductor substrate. As a method of grounding the one terminal of the switching device to the grounding conductor 15, it is proper to ground the one terminal of the switching device to the grounding conductor 15 via a through hole conductor formed in a through hole that penetrates the dielectric substrate 10 or the semiconductor substrate in the direction of thickness or to ground the one terminal of the switching device to the grounding conductor 15 via a conductor or a wire formed on the outer side surface of the dielectric substrate 10 or the semiconductor substrate.

Although the width w, the interval t and the coupling length L are made identical in the above preferred embodiments and the above modified preferred embodiments (particularly in the case of a plurality of floating conductors 11, 12 and 13) in the above preferred embodiments and the above modified preferred embodiments, the present invention is not limited to this, and the dimensional values may be set so as to be appropriately changed.

In the above preferred embodiments and the above modified preferred embodiments, the FET may be an enhancement type FET or a depletion type FET. In the case of the latter, it is required to apply a negative DC voltage when turning off the FETs 41, 42, 43, 41*a* and 41*b*.

Although the resistors 51, 52, 53, 51*a* and 51*b* are employed in the above preferred embodiments and the above modified preferred embodiments, the present invention is not limited to this, and a transmission line that operates as an inductor may be employed.

According to the above preferred embodiments of the present invention, by changing the above coupling coefficient, it is allowed to execute switching between the transmission, the attenuation or the interruption of the microwave signal, and the amount of attenuation in the off-state is greater than in the prior art. The microwave circuit does not require a manufacturing process of high accuracy, and therefore, the circuit can be easily manufactured at low cost. Furthermore, the circuit requires neither an input and output matching circuit such as the quarter-wave plates 152, 153 and 154 nor the like as compared with the prior art, and therefore, the circuit can be more compacted and reduced in weight.

Although the present invention has been fully described in connection with the preferred embodiments thereof with reference to the accompanying drawings, it is to be noted that various changes and modifications are apparent to those skilled in the art. Such changes and modifications are to be understood as included within the scope of the present invention as defined by the appended claims unless they depart therefrom.

What is claimed is:

1. A microwave circuit comprising:

a substrate having first and second surfaces parallel to each other;

two microstrip conductors on the first surface of said substrate, parallel to each other, electromagnetically coupled to each other, and having a coupling coefficient;

a grounding conductor on the second surface of said substrate;

a plurality of floating conductors on the first surface of said substrate, arranged parallel to each other and interposed between said two microstrip conductors; and a plurality of switching devices having respective first and second terminals, the first terminal of each switching device being connected to a corresponding one of said floating conductors, and a second terminal that is grounded, said switching devices being selectively turned on and off, wherein said substrate, said two microstrip conductors, and said grounding conductor constitute a coupler, said floating conductors being grounded when corresponding switching devices are turned on, said floating conductors having a floating potential when corresponding switching devices are turned off, and the coupling coefficient is stepwise changed by turning on or off said switching devices.

2. The microwave circuit according to claim 1, further comprising an amplifier connected to one of said two microstrip conductors.

3. A feedback amplifier comprising:

a microwave circuit including:

a substrate having first and second surfaces parallel to each other;

two microstrip conductors on the first surface of said substrate, parallel to each other, electromagnetically coupled to each other, and having a coupling coefficient;

a grounding conductor on the second surface of said substrate;

a plurality of floating conductors on the first surface of said substrate, arranged parallel to each other and interposed between said two microstrip conductors;

a plurality of switching devices having respective first and second terminals, the first terminal of each switching device being connected to a corresponding one of said floating conductors, and a second terminal that is grounded, said switching devices being selectively turned on and off, wherein said substrate, said two microstrip conductors, and said grounding conductor constitute a coupler, said floating conductors being grounded when corresponding switching devices are turned on, said floating conductors having a floating potential when corresponding switching devices are turned off, and the coupling coefficient is stepwise changed by turning on or off said switching devices; and an amplifier having an input port, an output port, and a feedback loop; and a feedback circuit, wherein said feedback loop includes, connected in series, said microwave circuit and said feedback amplifier.

4. A microwave circuit comprising:

a substrate having first and second surfaces parallel to each other;

first and second microstrip conductors on the first surface of said substrate, parallel to each other, electromagnetically coupled to each other and having a first coupling coefficient;

a grounding conductor on the second surface of said substrate;

a third microstrip conductor on the first surface of said substrate, parallel to said first microstrip conductor and electromagnetically coupled to said first microstrip conductor with a second coupling coefficient;

at least one first floating conductor on the first surface of said substrate and interposed between said first and second microstrip conductors;

at least one second floating conductor on the first surface of said substrate and interposed between said first and third microstrip conductors;

a first switching device having a first terminal connected to a first end of said first floating conductor and having a second terminal grounded, said first switching device being selectively turned on and off; and a second switching device having a first terminal connected to a first end of said second floating conductor and having a second terminal grounded, said second switching device being selectively turned on or off, wherein said substrate, said first and second microstrip conductors, and said grounding conductor constitute a coupler, the first coupling coefficient becomes larger than the second coupling coefficient when said first switching device is turned off and said second switching device is turned on, the first coupling coefficient becomes smaller than the second coupling coefficient when said first switching device is turned on and said second switching device is turned off, and said microwave circuit operates as a switching circuit to selectively and electromagnetically couple said first microstrip conductor with one of said second microstrip conductor and said third microstrip conductor.

5. The microwave circuit according to claim 4, further comprising:

first phase shifting means, connected to said second microstrip conductor, for shifting a signal inputted from said second microstrip conductor by a first phase shift amount, and outputting a resulting phase-shifted signal;

second phase shifting means, connected to said third microstrip conductor, for shifting a signal inputted from said third microstrip conductor by a second phase shift amount, and outputting a resulting phase-shifted signal; and combining means for combining the signal outputted from said first phase shifting means with the signal outputted from said second phase shifting means, and outputting a combined signal.

6. The microwave circuit according to claim 4, wherein said first microstrip conductor is connected to an antenna, said second microstrip conductor is connected to a transmitter, said third microstrip conductor is connected to a receiver, and said microwave circuit operates as a transmit and receive switch for a transceiver.

7. A method of manufacturing a microwave circuit, comprising:

forming a coupler comprising two microstrip conductors on a substrate, parallel to each other, electromagnetically coupled to each other and having a coupling coefficient, said substrate having a rear surface on which a grounding conductor is located;

forming a floating conductor on said substrate and interposed between said two microstrip conductors;

forming a switching device having a first terminal connected to one end of said floating conductor and having a second terminal grounded, said switching device being selectively turned on and off; and adjusting the coupling coefficient by changing a total length of said floating conductor relative to said two microstrip conductors.

* * * * *